(12) United States Patent
Jacobs

(10) Patent No.: US 11,430,758 B2
(45) Date of Patent: Aug. 30, 2022

(54) CREATING 3D FEATURES THROUGH SELECTIVE LASER ANNEALING AND/OR LASER ABLATION

(71) Applicant: TEXAS INSTRUMENTS INCORPORATED, Dallas, TX (US)

(72) Inventor: Simon Joshua Jacobs, Lucas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 65 days.

(21) Appl. No.: 16/729,018

(22) Filed: Dec. 27, 2019

(65) Prior Publication Data

US 2020/0211995 A1 Jul. 2, 2020

Related U.S. Application Data

(60) Provisional application No. 62/786,393, filed on Dec. 29, 2018.

(51) Int. Cl.
| | | |
|---|---|---|
| *H01L 25/065* | (2006.01) | |
| *B23K 1/005* | (2006.01) | |
| *H01L 23/00* | (2006.01) | |
| *H01L 25/00* | (2006.01) | |

(52) U.S. Cl.
CPC ............ *H01L 24/27* (2013.01); *B23K 1/0056* (2013.01); *H01L 24/29* (2013.01); *H01L 24/32* (2013.01); *H01L 24/83* (2013.01); *H01L 25/0657* (2013.01); *H01L 25/50* (2013.01); *H01L 2224/2763* (2013.01); *H01L 2224/29005* (2013.01); *H01L 2224/29109* (2013.01); *H01L 2224/29111* (2013.01); *H01L 2224/29139* (2013.01); *H01L 2224/29144* (2013.01); *H01L 2224/29147* (2013.01); *H01L 2224/29155* (2013.01); *H01L 2224/32145* (2013.01); *H01L 2224/83801* (2013.01); *H01L 2225/06565* (2013.01); *H01L 2924/014* (2013.01)

(58) Field of Classification Search
CPC ............ B23K 1/0056; H01L 2924/014; H01L 2224/2763; H01L 2224/32165
See application file for complete search history.

(56) References Cited

U.S. PATENT DOCUMENTS

| | | | | |
|---|---|---|---|---|
| 2005/0067688 A1* | 3/2005 | Humpston | ............... | H01L 24/11 257/784 |
| 2018/0158801 A1* | 6/2018 | Takano | ................ | H03H 9/0523 |
| 2020/0126946 A1* | 4/2020 | Joshi | ........................ | H01L 24/33 |

* cited by examiner

*Primary Examiner* — Dale E Page
*Assistant Examiner* — Wilner Jean Baptiste
(74) *Attorney, Agent, or Firm* — Michelle F. Murray; Charles A. Brill; Frank D. Cimino

(57) ABSTRACT

A semiconductor device includes a solder supporting material above a substrate. The semiconductor device also includes a solder on the solder supporting material. The semiconductor device further includes selective laser annealed or laser ablated portions of the solder and underlying solder supporting material to form a semiconductor device having 3D features.

19 Claims, 3 Drawing Sheets

CREATING 3D FEATURES THROUGH SELECTIVE LASER ANNEALING AND/OR LASER ABLATION

CROSS-REFERENCE TO RELATED APPLICATION(S)

This application claims priority to U.S. Provisional Application No. 62/786,393, filed Dec. 29, 2018, which is hereby incorporated by reference.

BACKGROUND

Indium/Bismuth (In/Bi) layers have been used as selective resists with laser exposure in creating three-dimensional (3D) features for microelectronic device packages. However, these resist layers are only at most ~0.1 um thick and require removal at a later time by, for example, etching chemistry. These, and other methods of creating 3D features which rely on lithographic patterning of multiple layers, add significant cost, extra process steps, and cycle time to the fabrication process.

SUMMARY

In one aspect, a semiconductor device includes a solder supporting material above a substrate. The semiconductor device also includes a solder on the solder supporting material. The semiconductor device further includes selective laser annealed or laser ablated portions of the solder and underlying solder supporting material to form a semiconductor device having 3D features.

In another aspect, a method includes forming a solder above a substrate. The method also includes performing laser annealing or laser ablation to the solder to form a semiconductor device having 3D features.

In yet another aspect, a method of fabricating a microelectronic device package includes forming a solder on a solder supporting material above a substrate. The method also includes performing selective laser annealing or laser ablation to the solder and underlying solder supporting material to form a first semiconductor device having 3D features. The method further includes bonding a second semiconductor device or chip to the 3D features to form an enclosure with the first semiconductor device. The method yet further includes heating the enclosure, and applying pressure to the enclosure to form the microelectronic device package.

DETAILED DESCRIPTION

Figure 1A:
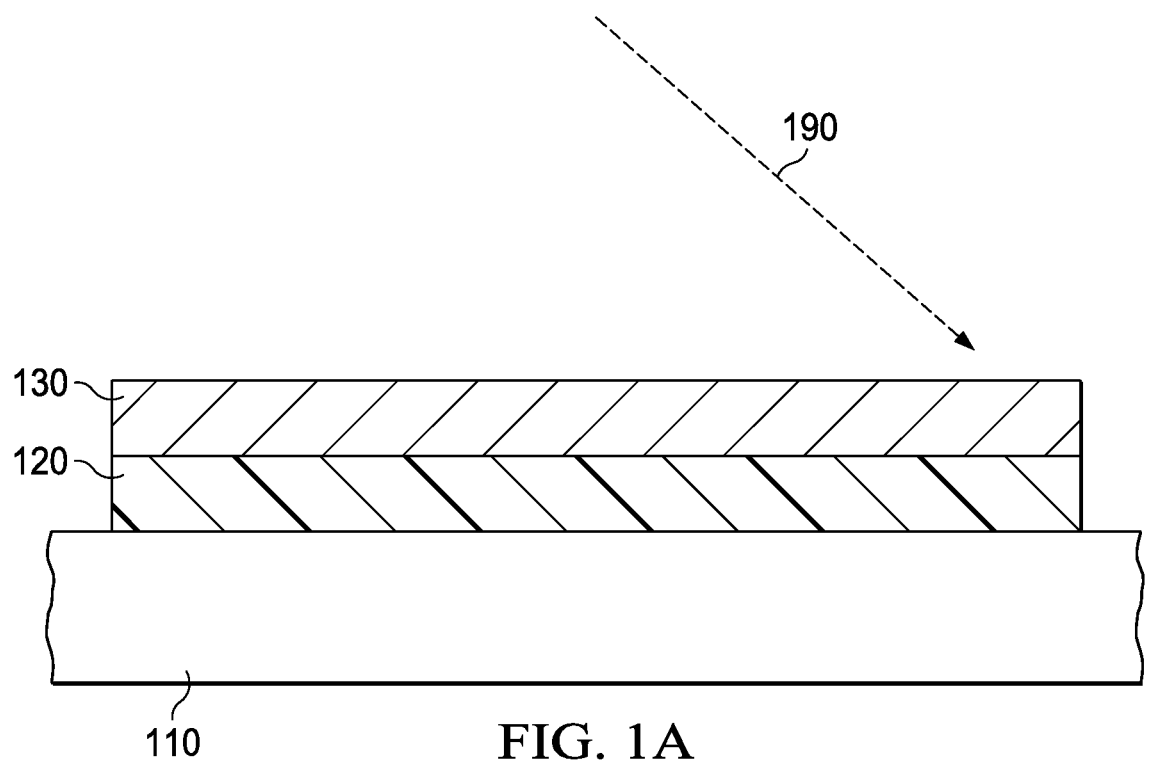
FIG. 1A is a cross-sectional side view of solder disposed on a solder supporting material disposed above a substrate, prior to exposure of the solder and solder supporting material to a laser annealing or laser ablation step.

In this description, the term "couple" or "couples" means either an indirect or direct wired or wireless connection. Thus, if a first device couples to a second device, that connection may be through a direct connection or through an indirect connection via other devices and connections. Also, in this description, the recitation "based on" means "based at least in part on." Therefore, if X is based on Y, then X may be a function of Y and any number of other factors.

For purposes of this description, the term "semiconductor device" may refer to an element or device comprising a die or substrate (e.g., a ceramic substrate, an organic substrate, etc.) which may have a round or non-round shape.

Features such as stand-offs, flow-control structures, and the like are often desirable for controlling the ultimate disposition, shape, distribution, etc. of solders, such as transient liquid phase (TLP) solders which are useful for sealing cavity packages such as hermetic microelectronic device packages. Aspects of this description selectively form such structures in solder-bearing areas of a substrate. The improved package may demonstrate improved yield or hermeticity, reduced reaction among solder and other package components, better controlled push-out of solder during sealing, etc.

Aspects of this description use selective laser annealing and/or selective laser ablation on a deposited solder layer, and optionally, layer(s) underlying the solder layer, in order to create the desired 3D features on the substrate prior to the sealing process.

These 3D features may include standoffs, flow control structures, stippling, or other features as desired in order to control the flow of the solder or limit the interaction of the solder with certain internal package components during the package sealing process, which may be a semiconductor device or chip bonding process.

This type of selective process may be especially advantageous when applied to a TLP bonding solder system. In such a system, a low melting temperature solder-supporting low-melting point alloy or metal (e.g., In) reacts with a solid phase high-melting point alloy or metal (e.g., Au) to provide a bond whose re-melting temperature is substantially higher than the original melting temperature of the high-melting point alloy or metal. An exemplary system for TLP bonding is indium-gold (In—Au). Indium melts at 156° C. Once the indium reacts (i.e. is annealed) with solid gold, the re-melting temperature of the various phases formed exceeds 400° C. Other exemplary TLP systems may include In—Ag, Sn—Au, Cu—Sn, Ni—Sn, etc.

In an aspect of this description, the transient liquid phase metal system may be formed by sequentially electroplating, e.g., gold followed by indium on selected areas of a substrate. The area may be selected by, for example, use of a photomask or by use of a patterned seed metal.

At an intermediate step, after the electroplating is complete, and before the package is sealed, e.g., by semiconductor device-to-semiconductor device/chip bonding, laser radiation is selectively applied to areas of the substrate containing the low-melting material component (e.g., In). In areas where a standoff or stop is to be created, the energy imparted to the low-melting material is sufficient to induce reaction with the underlying metallization (e.g., Au), e.g. by melting and reflow, or by solid-solid reaction. In areas where it is desired to remove solder, laser radiation is selectively applied to ablate the solder layer which results in removal of at least part of the solder layer in the irradiated zone by instantaneous vaporization/oxidation or other similar mechanism substantially associated with laser ablation.

In an aspect of this description, a single laser may be employed and may be tuned in frequency, pulse width, etc. Such a flexible system may be designed which can achieve both laser annealing and/or laser ablation upon selection, thereby providing maximum flexibility to the design and application of TLP bonding and/or solder bonding.

Aspects of this description may create a variety of desirable structural 3D features after the application of the solder layer(s) to the substrate. These features may be achieved with selective laser processing (e.g., laser annealing and/or laser ablation) which is fast and inexpensive. Alternative methods to create features additively or subtractively below or above the solder layers using photolithography, deposition, and etching have been employed. However, by employing aspects of this description, the selective laser treatment of these solder layers is, by comparison, faster, cheaper, and more flexible than these standard methods of microelectronic fabrication.

Lasers capable of achieving the selective annealing or ablation of solder areas in aspects of this description are commercially available at relatively low cost. For example, nanosecond, picosecond, or femtosecond lasers are widely commercially available and may be employed for annealing and/or ablation.

FIG. 1A is a cross-sectional side view of solder 130 disposed on a solder supporting material 120 disposed above a substrate 110, prior to exposure of the solder 130 and solder supporting material 120 to a laser annealing or laser ablation step. The figure shows a laser beam 190 to be applied to a portion of the solder 130 and solder supporting material 120. The substrate 110 may be a semiconductor device substrate such as silicon or glass.

The ablation threshold is the incident power density at which material is removed from the surface of the solder supporting material by the thermal effects of laser radiation. Below the ablation threshold, absorbed laser energy can deposit sufficient heat into the structure which causes the low-melting solder component to melt, whereupon it reacts with the underlying solder supporting material to form one or more alloys with a much higher melting temperature and consequently quickly resolidifies (within a matter of a few seconds).

Figure 1B:
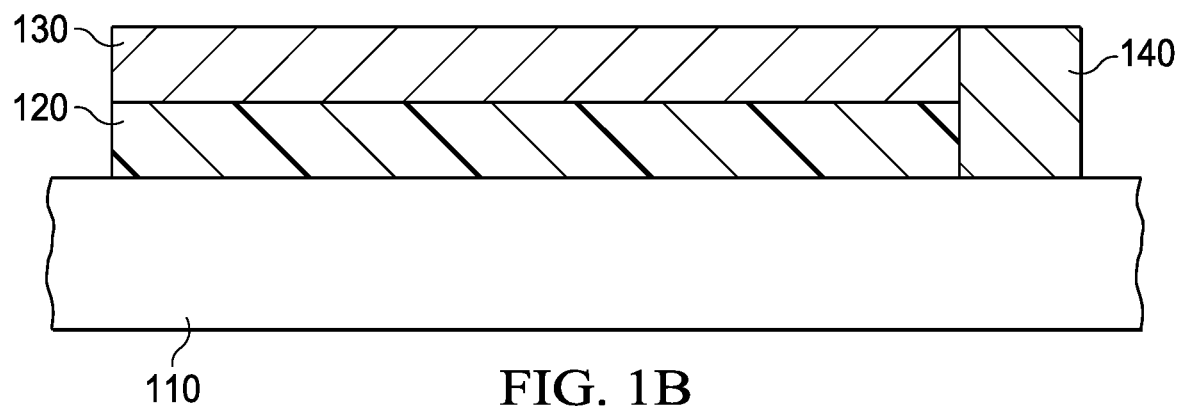
FIG. 1B is a cross-sectional side view of solder disposed on a solder supporting material disposed above a substrate, subsequent to exposure of the solder and solder supporting material to a laser annealing step, in accordance with this description.

Details of this process for an example are as follows:
Power density required to melt 1 um thick Indium RT-175C+Latent heat ~1 μJ/um$^2$
Indium is only ~10% absorbing, therefore 10 μJ/μm$^2$
λ (laser wavelength for a Ti:Sapphire tunable laser)=800 nm
Energy density needed to melt 1 μm thick In is close to ablation threshold when running pulsed mode at 800 nm
Alloying reaction proceeds out from top of Au layer; transient liquid phase not long-lived enough when semiconductor device at room temp to allow full alloying FIG. 1B is a cross-sectional side view of solder 130 disposed on a solder supporting material 120 disposed above a substrate 110, subsequent to exposure of the solder 130 and solder supporting material 120 to a laser annealing step. The solder 130 and solder supporting material 120 layers are formed by, for example, electroplating, and are therefore distinct. For instance, solder supporting material 120 may comprise electroplated Au of thickness from 0.1-10 microns, preferably 0.5-5.0 microns, while solder 130 may comprise electroplated In of thickness 0.1-5.0 microns, preferably 1.5-5.0 microns. Laser radiation is applied to heat a desired area of the structure such that the solder 130 and solder supporting material 120 thereby form an annealed/fused/intermixed alloy 140. When annealing, the alloy 140 that is formed during the laser annealing will melt (re-melt) at a higher temperature. Once the two layers are melted together (fused/intermixed), the resultant alloy will not melt at the same temperature as the rest of the non-annealed solder. Thus, a stepwise creation of different patterns on the substrate may be contemplated. One or more steps of irradiation may be needed to create the desired 3D feature.

In an aspect of this description, indium is irradiated locally on one substrate before trying to attach to another substrate using the TLP bond technology. With laser annealing, indium melts and mixes/fuses atomically with gold. Annealing of selective areas of such a structure may be desirable, for instance, to create an area defining a boundary or a barrier is created to affect or otherwise block the flow of indium. In an example, laser processing may be applied (to the gold overplated by indium) in the form of a sealing ring. Spatially contiguous irradiation around the perimeter of one or more of said sealing rings on the solder supporting material 120 creates a sealing ring that forms a boundary so that liquid indium remains only within a desired area during the high-temperatures associated with a subsequent semiconductor device-to-semiconductor device or chip-to-semiconductor device sealing process.

Figure 3:
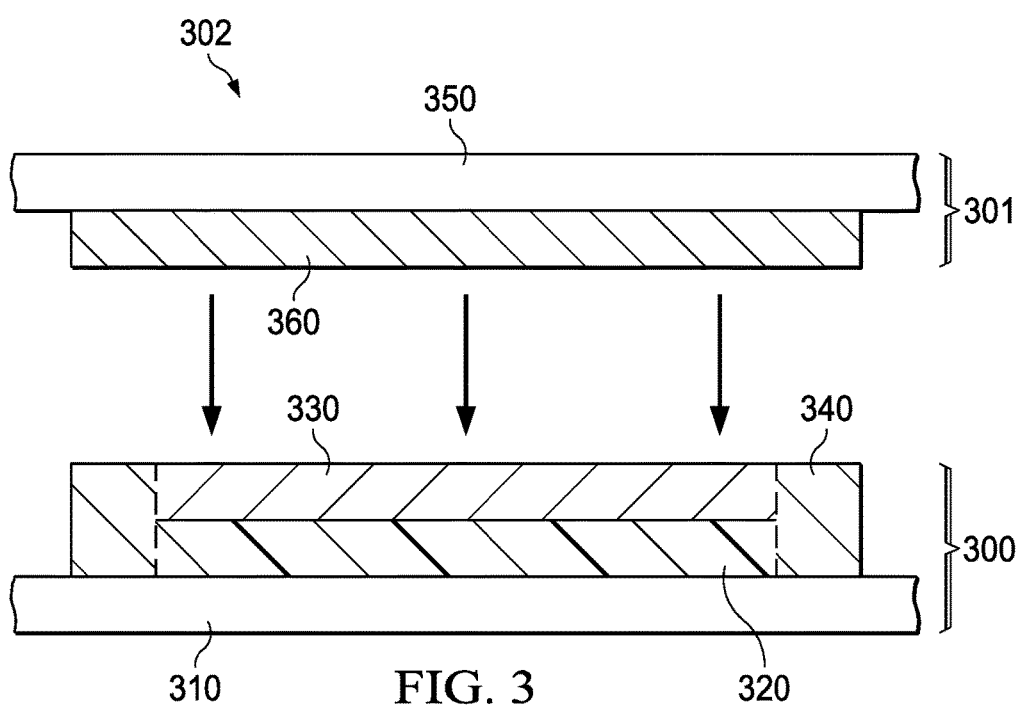
FIG. 3 is a cross-sectional side view of a step in the fabrication of a microelectronic device package, in accordance with this description.

With reference to FIG. 3, an upper, gold-coated substrate (forming a cap) is brought into contact with the lower substrate having the laser annealed solder and solder supporting material portions and the two semiconductor devices are sandwiched. The sandwiched semiconductor devices then are heated in a chamber where the TLP reaction process occurs. During the TLP reaction process, the liquid indium is largely or entirely constrained by the barrier where the laser previously was applied.

Aspects of this description use the laser treated areas as a 3D structural feature in subsequent or final bonding, not as a resist layer that is removed at a later time by etching chemistry. Thus, the additional step of etching is not a required feature of the process of this description.

Figure 2:
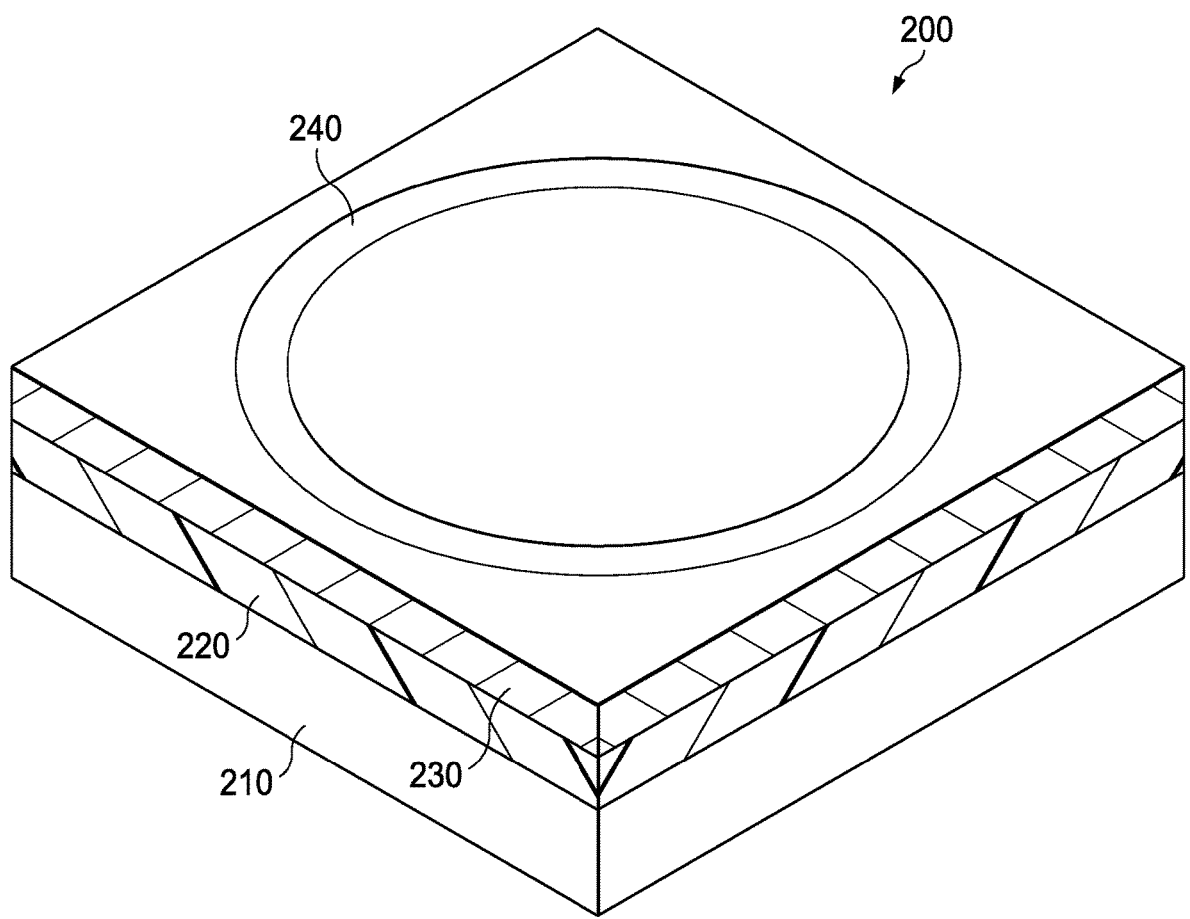
FIG. 2 is an elevated perspective view of a semiconductor device having 3D features for a microelectronic device package, in accordance with this description.

With reference to FIG. 2, in one aspect, the figure shows an elevated perspective view of a semiconductor device 200 having 3D features for a microelectronic device package includes a solder supporting material 220 disposed above a substrate 210. The semiconductor device 200 also includes a solder 230 disposed on the solder supporting material 220. The semiconductor device 200 further includes selective laser annealed or laser ablated portions 240 of the solder and underlying solder supporting material to thereby form a semiconductor device 200 having 3D features.

In an example, the laser annealed and laser ablated portions of the solder and solder supporting material are present. The solder may be a transient liquid phase (TLP) solder and the non-laser annealed or non-laser ablated portions of the solder is at least 1.0 μm thick. The 3D features may be employed as structural features that bond the semiconductor device 300 (FIG. 3) to another semiconductor device 301 or a chip to form the microelectronic device package 302. The solder may include at least one material selected from the group consisting of indium, tin, and combinations thereof, and the solder supporting material may be selected from the group consisting of nickel, copper, gold, silver, and combinations thereof. The selective laser annealed portions of the solder and underlying solder supporting material form an annealed mixture of the solder and underlying solder supporting material, the annealed mixture form the 3D features and have a melting point which is higher than the non-laser annealed solder. The microelectronic device package 302 may be a microelectromechanical systems (MEMS) device package.

FIG. 3, as discussed above, is a cross-sectional side view of a step in the fabrication of a microelectronic device package 302. The microelectronic device package 302 includes a semiconductor device 300 (similar to semiconductor device 200 in FIG. 2) including a solder 330 disposed on solder supporting material 320 which is disposed above a substrate 310. The semiconductor device 300 also includes selective laser annealed or laser ablated portions 340 of the solder and underlying solder supporting material to thereby form a semiconductor device 300 having 3D features. FIG. 3 also illustrates another semiconductor device 301 which includes a high-melting point metal 360 (such as Au, Ag, Cu, or Ni) disposed below a substrate 350. The microelectronic device package 302 is formed upon heating of the semiconductor devices 300, 301 in a chamber at a temperature at or above the melting temperature of the solder component. While the semiconductor devices 300, 301 are heated, pressure (in a pressure range of between 50 N and 100,000 N) is applied to the heated semiconductor devices 300, 301 causing the flow of solder to be made in the presence of the 3D features (which function as borders, stand-offs, etc.) created by the laser annealing and/or ablation, to thereby form a hermetically sealed microelectronic device package 302.

Figure 4:
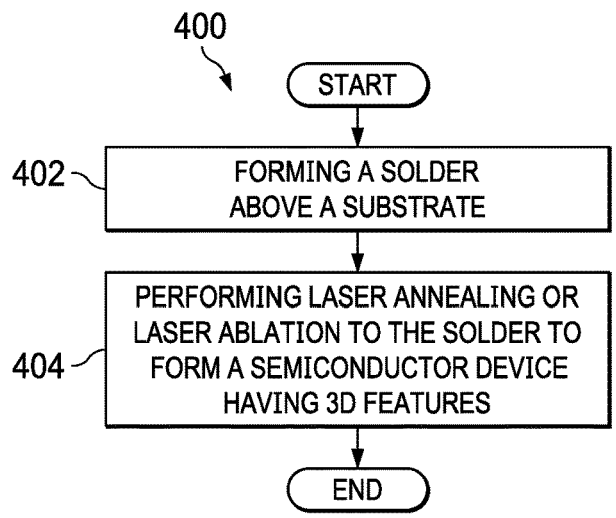
FIG. 4 is a flowchart illustrating a method of fabricating a semiconductor device having 3D features, in accordance with this description.

With reference to FIG. 4, in another aspect, a method 400 of fabricating a semiconductor device having 3D features includes forming a solder above a substrate (block 402). The method 400 also includes performing laser annealing or laser ablation to the solder to thereby form a semiconductor device having 3D features (block 404).

In an example of the method of fabricating a semiconductor device, the laser annealing or laser ablation is selectively performed. Alternatively, the laser annealing and laser ablation may both be selectively performed, and may do so, optionally, using a same/single laser. The solder may be a transient liquid phase (TLP) solder and may be at least 1.0 µm thick prior to the performing step. The method may further include employing the 3D features as structural features in bonding the semiconductor device to another semiconductor device or a chip. The solder may include at least one material selected from the group consisting of indium, tin, and combinations thereof. The method may further include forming the solder on a solder supporting material selected from the group consisting of nickel, copper, gold, silver, and combinations thereof. The solder supporting material is formed above the substrate. The laser annealing may be selectively performed on the solder and underlying solder supporting material thereby resulting in an annealed mixture of the solder and underlying solder supporting material. The annealed mixture form the 3D features and have a melting point which is higher than the solder prior to the laser annealing.

Figure 5:
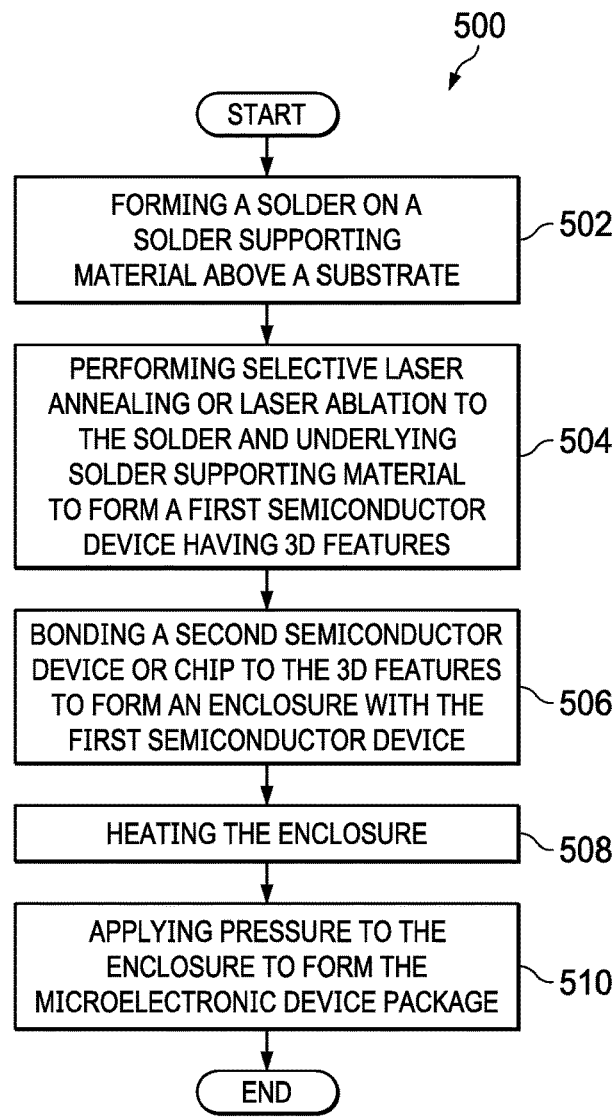
FIG. 5 is a flowchart illustrating a method of fabricating a microelectronic device package, in accordance with this description.

With reference to FIG. 5, in yet another aspect, a method 500 of fabricating a microelectronic device package includes forming a solder on a solder supporting material above a substrate (block 502). The method 500 also includes performing selective laser annealing or laser ablation to the solder and underlying solder supporting material to thereby form a first semiconductor device having 3D features (block 504). The method 500 further includes bonding a second semiconductor device or chip to the 3D features to thereby form an enclosure with the first semiconductor device (block 506). The method 500 yet further includes heating the enclosure (block 508), and applying pressure to the enclosure to thereby form the microelectronic device package (block 510).

In an example of the method of fabricating a microelectronic device package, the solder may include at least one material selected from the group consisting of indium, tin, and combinations thereof. The solder supporting material may be selected from the group consisting of nickel, copper, gold, silver, and combinations thereof. The laser annealing may be selectively performed on the solder and underlying solder supporting material thereby resulting in an annealed mixture of the solder and underlying solder supporting material. The annealed mixture form the 3D features and have a melting point which is higher than the solder prior to the laser annealing.

The method steps in any of the examples described herein are not restricted to being performed in any particular order. Also, structures mentioned in any of the method examples may utilize structures mentioned in any of the device examples. Such structures may be described in detail with respect to the device examples only but are applicable to any of the method examples.

Features in any of the examples described in this description may be employed in combination with features in other examples described herein, and such combinations are considered to be within the spirit and scope of the present disclosure.

Modifications are possible in the described embodiments, and other embodiments are possible, within the scope of the claims.

What is claimed is:

1. A semiconductor device comprising:
a solder supporting material on a substrate;
solder on the solder supporting material; and
selective laser annealed or laser ablated portions of the solder and underlying solder supporting material forming 3D features.

2. The semiconductor device of claim 1, wherein both laser annealed and laser ablated portions of the solder and the solder supporting material are present.

3. The semiconductor device of claim 1, wherein the solder is a transient liquid phase (TLP) solder.

4. The semiconductor device of claim 1, wherein the non-laser annealed or non-laser ablated portions of the solder is at least 1.0 µm thick.

5. The semiconductor device of claim 1, wherein the 3D features are employed as structural features that bond the semiconductor device to another semiconductor device or a chip.

6. The semiconductor device of claim 1, wherein the solder comprises at least one material selected from the group consisting of indium, tin, and combinations thereof, and wherein the solder supporting material is selected from the group consisting of nickel, copper, gold, silver, and combinations thereof.

7. The semiconductor device of claim 6, wherein the selective laser annealed portions of the solder and underlying solder supporting material form an annealed mixture of the solder and underlying solder supporting material, the annealed mixture forming the 3D features and having a melting point which is higher than the non-laser annealed solder.

8. A semiconductor device comprising:
a substrate;
a solder region comprising:
- a solder supporting layer on the substrate, the solder supporting layer comprising a first material; and
- a solder layer on the solder supporting layer, the solder layer comprising a second material; and an alloy layer on the substrate, the alloy layer adjacent to the solder region, the alloy layer comprising an alloy of the first material and the second material.

9. The semiconductor device of claim 8, wherein the second material is indium or tin.

10. The semiconductor device of claim 8, wherein the first material is gold, silver, copper, or nickel.

11. The semiconductor device of claim 8, wherein the solder layer is at least one micron thick.

12. The semiconductor device of claim 8, wherein the solder layer comprises a transient liquid phase (TLP) solder.

13. The semiconductor device of claim 8, wherein the substrate is a first substrate, the semiconductor device further comprising:
- a metal layer on the solder region and the alloy layer; and
- a second substrate on the metal layer.

14. A semiconductor device comprising:
a first substrate;
a first metal layer on the first substrate;
a second substrate;
a solder region between the first metal layer and the second substrate, the solder region comprising:
- a second metal layer on the first metal layer, the second metal layer comprising a first material; and
- a third metal layer between the second metal layer and the second substrate, the third metal layer comprising a second material; and an alloy layer between the first metal layer and the second substrate, the alloy layer adjacent the solder region, the alloy layer comprising an alloy of the first material and the second material.

15. The semiconductor device of claim 14, wherein the alloy layer surrounds the solder region.

16. The semiconductor device of claim 14, wherein the first material is indium or tin.

17. The semiconductor device of claim 14, wherein the second material is gold, silver, copper, or nickel.

18. The semiconductor device of claim 14, wherein the second metal layer is at least one micron thick.

19. The semiconductor device of claim 14, wherein the second metal layer comprises a transient liquid phase (TLP) solder.

* * * * *